United States Patent
Klaassen

(10) Patent No.: US 8,730,454 B2
(45) Date of Patent: May 20, 2014

(54) EUV RADIATION SOURCE AND METHOD OF GENERATING EUV RADIATION

(75) Inventor: Michel François Hubert Klaassen, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 381 days.

(21) Appl. No.: 13/168,495

(22) Filed: Jun. 24, 2011

(65) Prior Publication Data

US 2012/0154775 A1 Jun. 21, 2012

Related U.S. Application Data

(60) Provisional application No. 61/359,591, filed on Jun. 29, 2010.

(51) Int. Cl.
| | | |
|---|---|---|
| G03B 27/54 | (2006.01) | |
| G03B 27/68 | (2006.01) | |
| G03B 27/32 | (2006.01) | |
| G03B 27/52 | (2006.01) | |
| G03B 27/72 | (2006.01) | |

(52) U.S. Cl.
USPC .......... 355/67; 355/52; 355/55; 355/71; 355/77

(58) Field of Classification Search
USPC .......... 355/30, 52, 53, 55, 67–71, 77; 250/492.1, 492.2, 492.22, 493.1, 548, 250/504 R; 313/231.61, 231.71; 315/111.21, 111.71
See application file for complete search history.

(56) References Cited

U.S. PATENT DOCUMENTS

| | | | | |
|---|---|---|---|---|
| 4,816,875 | A * | 3/1989 | Takeda et al. | 355/67 |
| 5,973,841 | A * | 10/1999 | Watanabe | 359/618 |
| 7,075,713 | B2 * | 7/2006 | Arenberg | 359/359 |
| 2002/0021508 | A1 * | 2/2002 | Ishihara | 359/853 |
| 2004/0165171 | A1 * | 8/2004 | Tran et al. | 355/71 |
| 2007/0002474 | A1 * | 1/2007 | Amemiya et al. | 359/857 |
| 2007/0228300 | A1 * | 10/2007 | Smith | 250/504 R |
| 2009/0032740 | A1 * | 2/2009 | Smith et al. | 250/503.1 |
| 2009/0289205 | A1 * | 11/2009 | Moriya et al. | 250/504 R |
| 2010/0140512 | A1 * | 6/2010 | Suganuma et al. | 250/504 R |
| 2011/0168925 | A1 * | 7/2011 | Ceglio et al. | 250/504 R |

* cited by examiner

*Primary Examiner* — Toan Ton
*Assistant Examiner* — Christina Riddle
(74) *Attorney, Agent, or Firm* — Sterne, Kessler, Goldstein & Fox P.L.L.C

(57) ABSTRACT

An EUV radiation source comprising a fuel supply configured to deliver droplets of fuel to a plasma formation location, and a collector configured to collect EUV radiation emitted by a plasma at the plasma formation location, wherein the collector has a reflective surface that is a modified ellipsoid shape, the modified ellipsoid shape providing improved intensity uniformity of collected EUV radiation in the far field compared with a perfect ellipsoid shape.

14 Claims, 6 Drawing Sheets

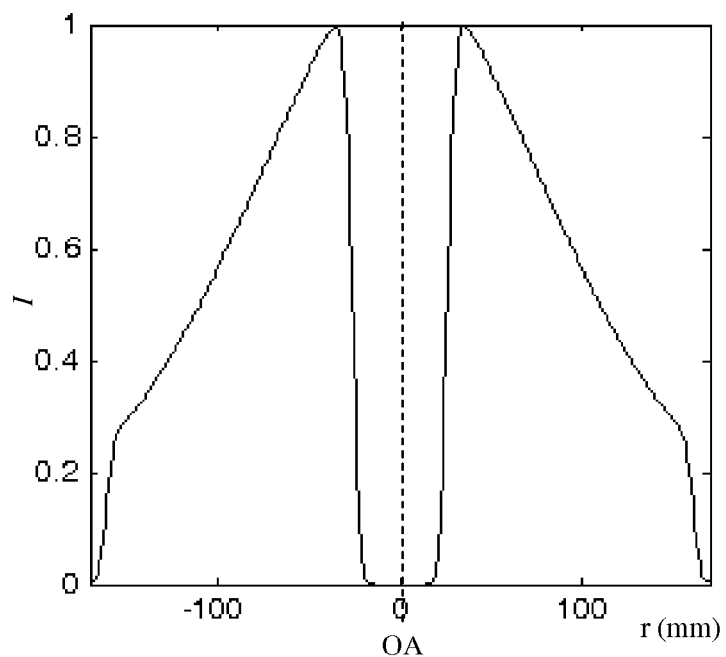
Figure 5 – Prior Art
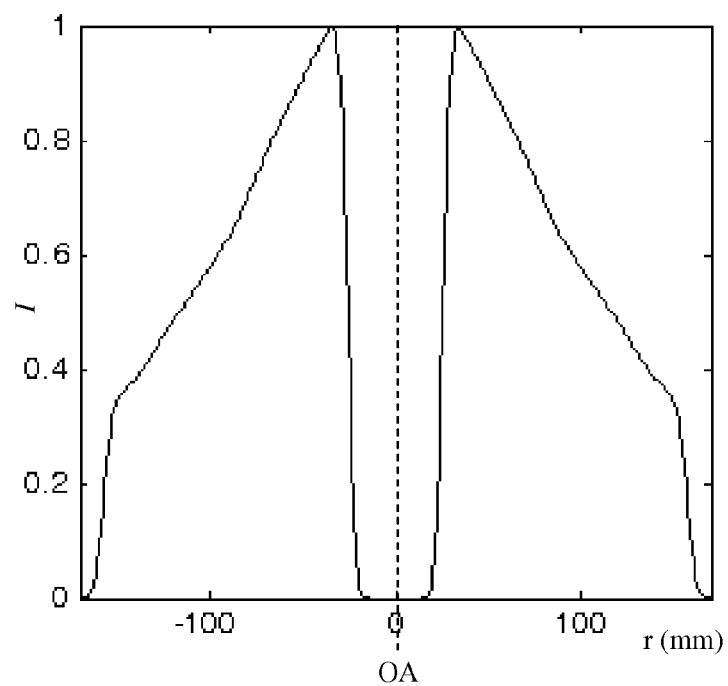
Figure 6

EUV RADIATION SOURCE AND METHOD OF GENERATING EUV RADIATION

CROSS-REFERENCE TO RELATED APPLICATIONS

This application claims benefit under 35 U.S.C. 119(e) to U.S. Provisional Application No. 61/359,591, filed Jun. 29, 2010, which is incorporated by reference herein in its entirety.

BACKGROUND OF THE INVENTION

1. Field of the Invention

The present invention relates to an EUV radiation source and a method of generating EUV radiation. The EUV radiation source may form part of a lithographic apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of one or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in the following equation:

$$CD = k_1 * \frac{\lambda}{NA}$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. An EUV radiation source for producing EUV radiation may include a laser for exciting a fuel to provide the plasma, and a source collector module for containing the plasma. The plasma may be created, for example, by directing a laser beam at a fuel, such as particles of a suitable material (e.g., tin). The resulting plasma emits output radiation, e.g., EUV radiation, which is collected using a collector. The collector may be a mirrored normal incidence collector, which receives the radiation and focuses the radiation into a beam. The EUV radiation source may include an enclosing structure or chamber arranged to provide a vacuum environment to support the plasma. Such an EUV radiation source is typically termed a laser produced plasma (LPP) source.

A problem associated with LPP sources is that there is considerable non-uniformity in the intensity of radiation that they generate.

It is desirable to provide an EUV radiation source that provides radiation with an improved intensity uniformity compared with at least some known EUV radiation sources.

BRIEF SUMMARY OF THE INVENTION

According to a first aspect of the invention, there is provided an EUV radiation source comprising a fuel supply configured to deliver droplets of fuel to a plasma formation location, and a collector configured to collect EUV radiation emitted by a plasma at the plasma formation location, wherein the collector has a reflective surface that is a modified ellipsoid shape, the modified ellipsoid shape providing improved intensity uniformity of collected EUV radiation in the far field compared with a perfect ellipsoid shape.

According to a second aspect of the invention there is provided a method of generating EUV radiation, the method comprising delivering droplets of fuel to a plasma formation location using a fuel supply, and collecting EUV radiation emitted by the plasma at the plasma formation location using a collector, wherein the collector has a reflective surface that is a modified ellipsoid shape, the modified ellipsoid shape providing the collected EUV radiation with improved intensity uniformity in the far field compared with a perfect ellipsoid shape.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 is a graph that illustrates the intensity profile of radiation incident upon a first mirror of a prior art lithographic apparatus;

FIG. 6 is a graph that illustrates the intensity profile of radiation incident upon a first mirror of the lithographic apparatus according to the embodiment of the invention.

DETAILED DESCRIPTION OF THE INVENTION

Figure 1:
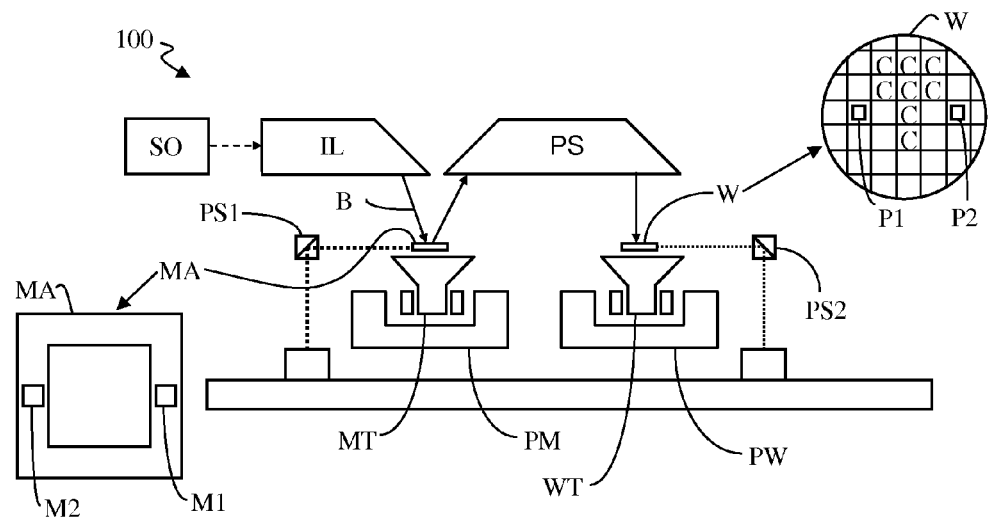
FIG. 1 depicts a lithographic apparatus according to an embodiment of the invention.

FIG. 1 schematically depicts a lithographic apparatus 100 according to one embodiment of the invention. The apparatus comprises:
- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As depicted here, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from a source collector module SO that comprises an EUV radiation source. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the de-magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
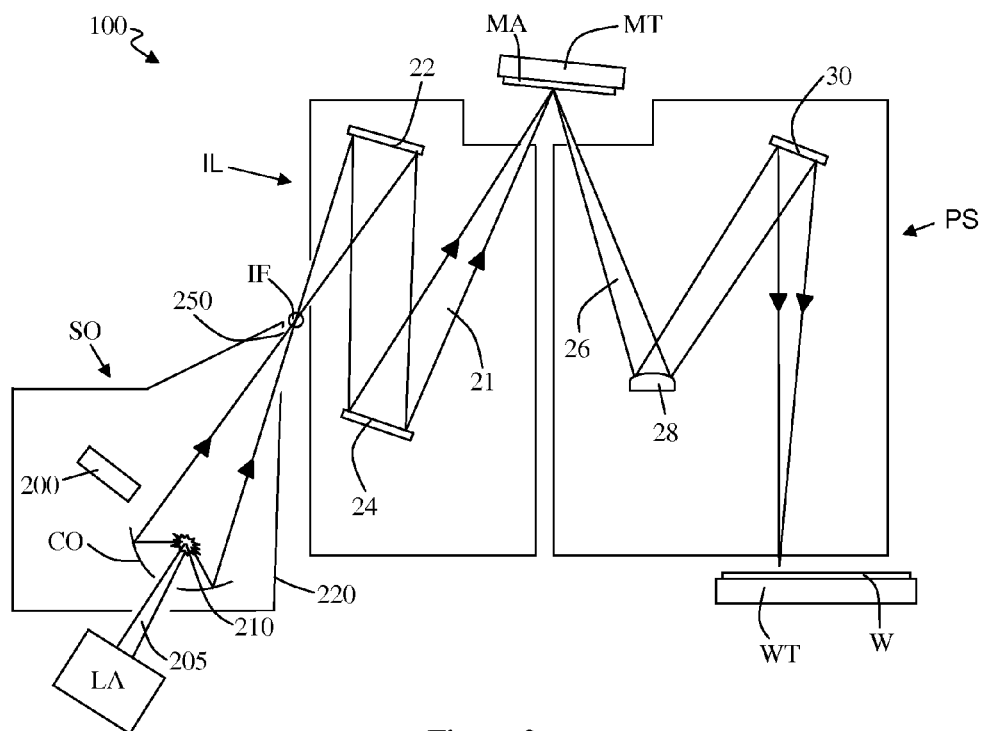
FIG. 2 is a more detailed view of the lithographic apparatus.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO.

The source collector module SO comprises an EUV radiation source that receives laser radiation generated by a laser LA. The laser LA is arranged to deposit laser energy via a laser beam 205 into a fuel, such as xenon (Xe), tin (Sn) or lithium (Li) that is provided from a fuel supply 200, thereby creating a highly ionized plasma 210 with electron temperatures of several 10's of eV. The energetic radiation generated during de-excitation and recombination of these ions is emitted from the plasma, collected and focussed by a collector CO.

Radiation that is reflected by the collector CO is focused in a virtual source point IF. As a result of reflecting the radiation an EUV beam of radiation is provided that converges towards the virtualo source point. The virtual source point IF is commonly referred to as the intermediate focus, and the source collector module SO may be arranged such that the intermediate focus IF is located at or near an aperture 250 in the enclosing structure 220. The virtual source point IF may be an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in the illumination system IL and projection system PS. Further, there may be more mirrors present than those shown in the Figures, for example there may be as many as 6 additional reflective elements present in the projection system PS than shown in FIG. 2.

In a conventional lithographic apparatus the collector CO is an ellipsoid shape. In embodiments of the invention the collector is a modified ellipsoid. The term modified ellipsoid is intended to mean a shape that is generally ellipsoid but includes modifications such that it is no longer a perfect ellipsoid shape.

Figure 3A:
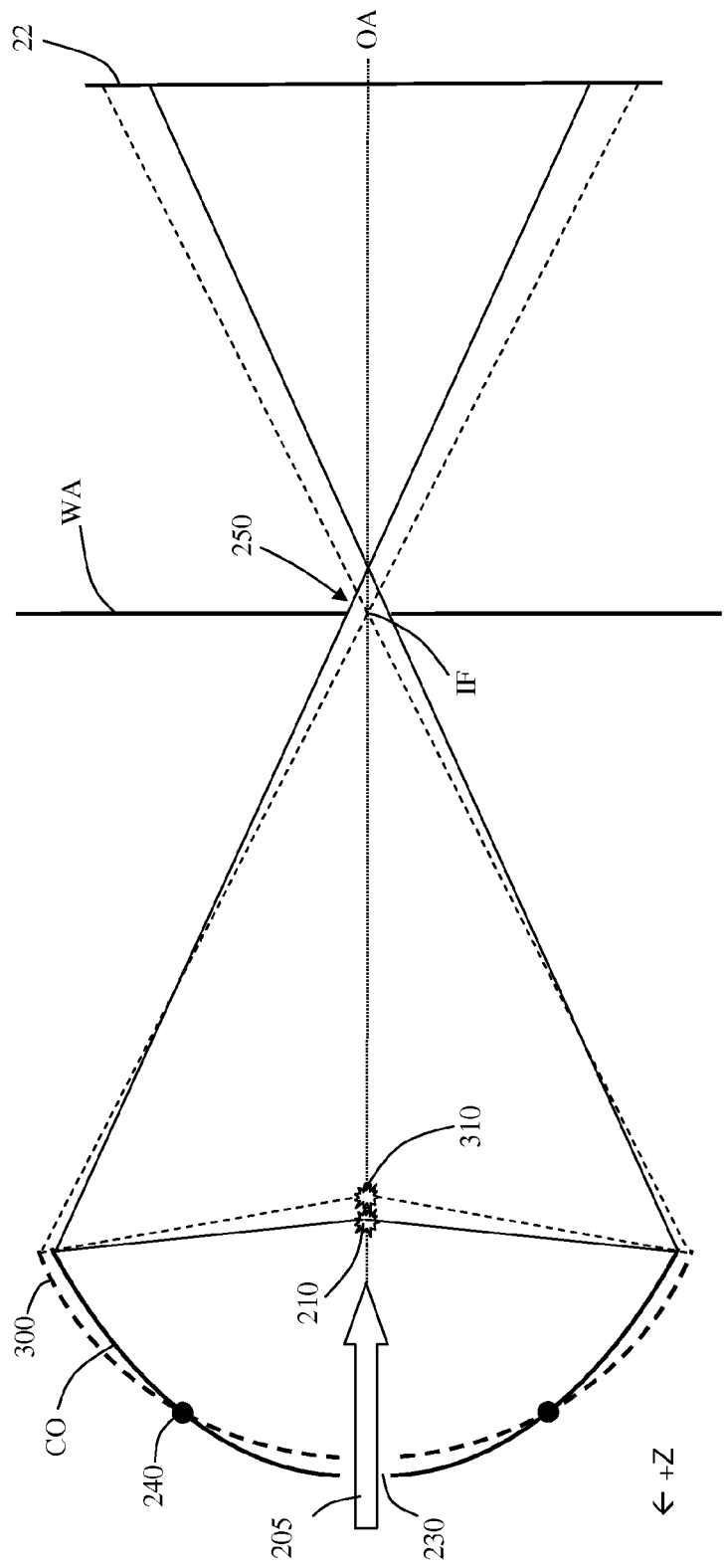
FIGS. 3a and 3b are an EUV radiation source according to an embodiment of the invention.

FIG. 3a is an enlarged view of an EUV radiation source according to an embodiment of the invention that forms part of the lithographic apparatus. The collector CO is shown in FIG. 3a, together with the first mirror 22 of the illumination system. Also shown in FIG. 3a is the aperture 250, which may, for example, be formed by a wall WA of the source collector module SO and/or a wall of the illuminator IL. The EUV radiation beam, obtained by reflection of EUV radiation at the collector CO, traverses the aperture. The vacuum conditions in the source collector module SO and the illuminator IL may differ, for example with the vacuum in the illuminator being higher than the vacuum in the source collector module. Where this is the case, it may be desirable to provide the aperture 250 between them, for example, to reduce the flow of gas from the source collector module SO to the illuminator IL.

The collector CO is provided with a hole 230 at a central location, the hole being large enough to accommodate a laser beam 205 generated by an excitation laser (for example a $CO_2$ laser). The hole 230 and aperture 250 both lie on an optical axis OA, which is indicated by a dotted line in FIG. 3a.

In use, a droplet of target material is directed towards a plasma formation location by a fuel supply (not shown in FIG. 3a). The laser beam 205 passes through the hole 230 in the collector CO, and is incident upon the fuel droplet. The laser beam 205 vaporizes the fuel droplet and thereby creates a plasma 210 at the plasma formation location.

Radiation emitted by the plasma 210 is collected by the collector CO and the reflected EUV radiation beam is focused through the aperture 250. The EUV radiation beam passes through the aperture 250 and is incident upon the first mirror 22 of the illuminator. In an embodiment, the first mirror 22 may be a facetted mirror. The first mirror 22 may be any suitable optical element. The first mirror 22 is shown as being perpendicular to the optical axis OA for ease of illustration. In practice, the first mirror 22 may be non-perpendicular to the optical axis OA, so that it may direct the radiation towards the second mirror 24 (see FIG. 2).

The collector CO has a reflective surface that has a modified ellipsoid shape in relation to a corresponding perfect ellipsiodal shape. The collector CO is not a reflector having a perfect ellipsoid shape. To facilitate comparison, a perfect ellipsoid is schematically shown in FIG. 3a as a dashed line 300. Referring to FIG. 3a, it may be seen that an inner portion of the reflective surface of the collector CO (i.e., the portion closest to the optical axis OA) curves outwardly relative to the perfect ellipsoid shape. In this context, the term "curves outwardly" may be interpreted as meaning curvature that causes the reflective surface of the collector CO to lie outside of the perfect ellipsoid shape 300. Similarly, an outer portion of the reflective surface of the collector CO (i.e., close to an outer edge of the collector) curves inwardly relative to the perfect ellipsoid shape. In this context, the term "curves inwardly" may be interpreted as meaning curvature that causes the reflective surface of the collector CO to lie inside the perfect ellipsoid shape 300. Referring to part of the reflective surface of the collector CO lying "inside the perfect ellipsoid shape" may be interpreted as meaning that that part of the reflective surface of the collector lies inside the shape that would be formed if the perfect ellipsoid shape 300 were extended to form a full perfect ellipsoid. Similarly, referring to the reflective surface of part of the collector CO lying "outside the perfect ellipsoid shape" may be interpreted as meaning that that part of the reflective surface of the collector lies outside the shape that would be formed if the perfect ellipsoid shape 300 were extended to form a full perfect ellipsoid.

At an intermediate location 240 the reflective surface of the collector CO intersects with the perfect ellipsoid shape.

Figure 3B:
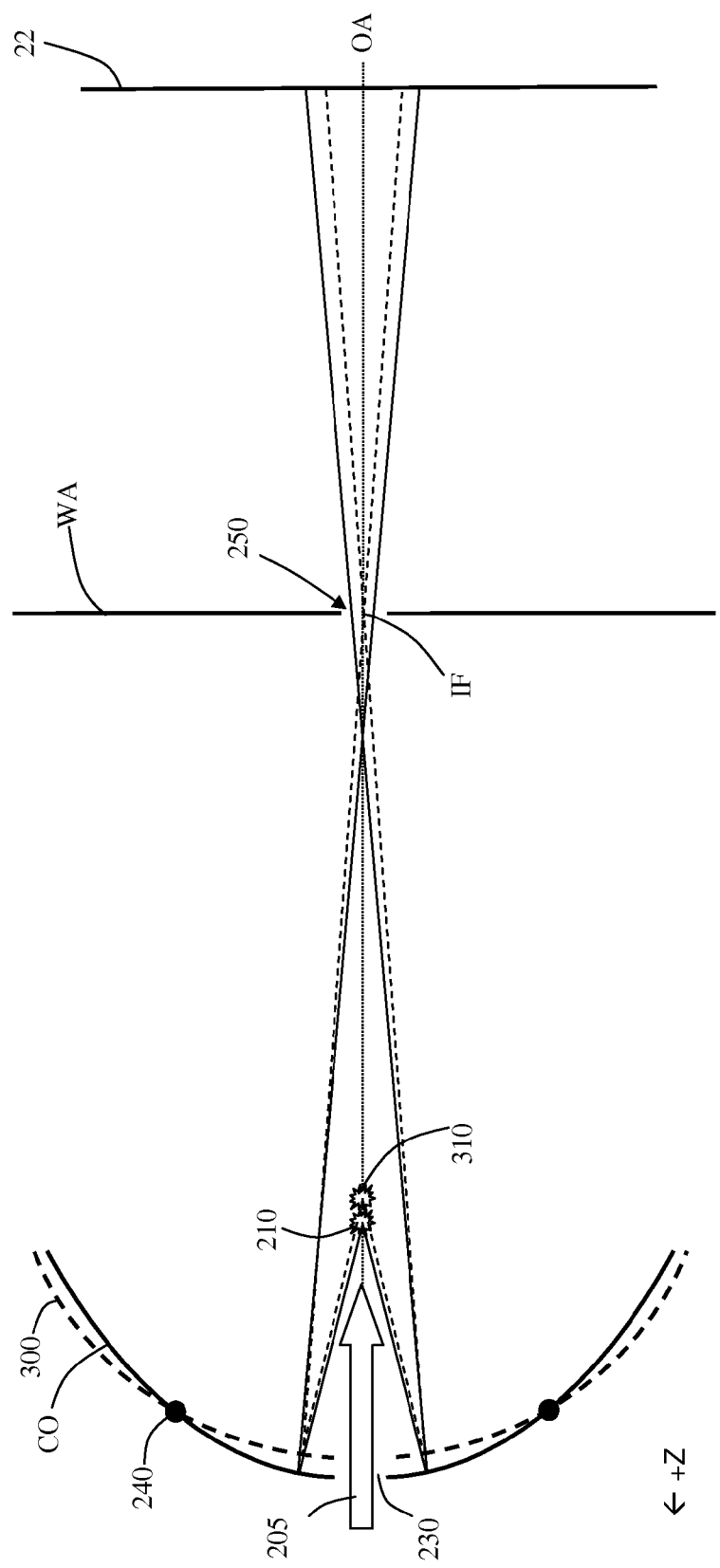

The effect of the modified ellipsoid shape of the collector CO is shown in FIGS. 3a and 3b. FIG. 3a shows EUV radiation as rays that travel to the outer portion of the collector CO, and FIG. 3b shows the radiation as rays that travel to the inner portion of the collector. These rays are shown in separate figures in order to avoid over complicating the figures.

Dealing first with the conventional collector 300 shown in FIG. 3a, a plasma 310 will give rise to radiation, indicated by dashed lines, which travels to the outer portion of the collector 300 and is reflected by the collector. The reflected radiation passes through an intermediate focus IF at the aperture 250 and is incident upon the first mirror 22. When the collector CO of the embodiment of the invention is used, the location at which the plasma is formed is moved to the left (indicated as the +Z direction in FIG. 3a). A plasma is thus generated at location 210 rather than at location 310. Radiation generated by the plasma 310 travels to the collector CO and is reflected by the collector. The radiation passes through the aperture 250, but is not focussed at an intermediate focus at the aperture. Instead, the radiation is focussed slightly behind the aperture 250. Since the radiation is focussed slightly behind the aperture 250, rather than for example being focussed a long way from the aperture, it is still able to pass through the aperture. The radiation may be clipped when it passes through the aperture 250, as explained further below. The radiation is incident upon the first mirror 22. As can be seen from FIG. 3a, the radiation is closer to the optical axis OA than the radiation that was collected by the conventional collector 300.

Referring to the conventional collector 300 shown in FIG. 3b, a plasma 310 will give rise to radiation, indicated by dashed lines, which travels to the inner portion of the collector 300 and is reflected by the collector. The reflected radiation passes through an intermediate focus IF at the aperture 250 and is incident upon the first mirror 22. When the collector CO of the embodiment of the invention is used, the plasma is generated at location 210 rather than at location 310. Radiation generated by the plasma 210 travels to the collector CO and is reflected by the collector. The radiation passes through the aperture 250, but is not focussed at an intermediate focus at the aperture. Instead, the radiation is focussed slightly before the aperture 250. The radiation may be clipped when it passes through the aperture 250. The radiation is incident upon the first mirror 22. As can be seen, the radiation is further from the optical axis OA than the radiation that was collected by the conventional collector 300.

FIGS. 3a and 3b are intended to schematically illustrate the effect of the collector CO according to an embodiment of the invention. They are not intended to provide an accurate indication of the shape of the collector CO. The shape of the collector CO may be better understood with reference to FIG. 4.

Figure 4:
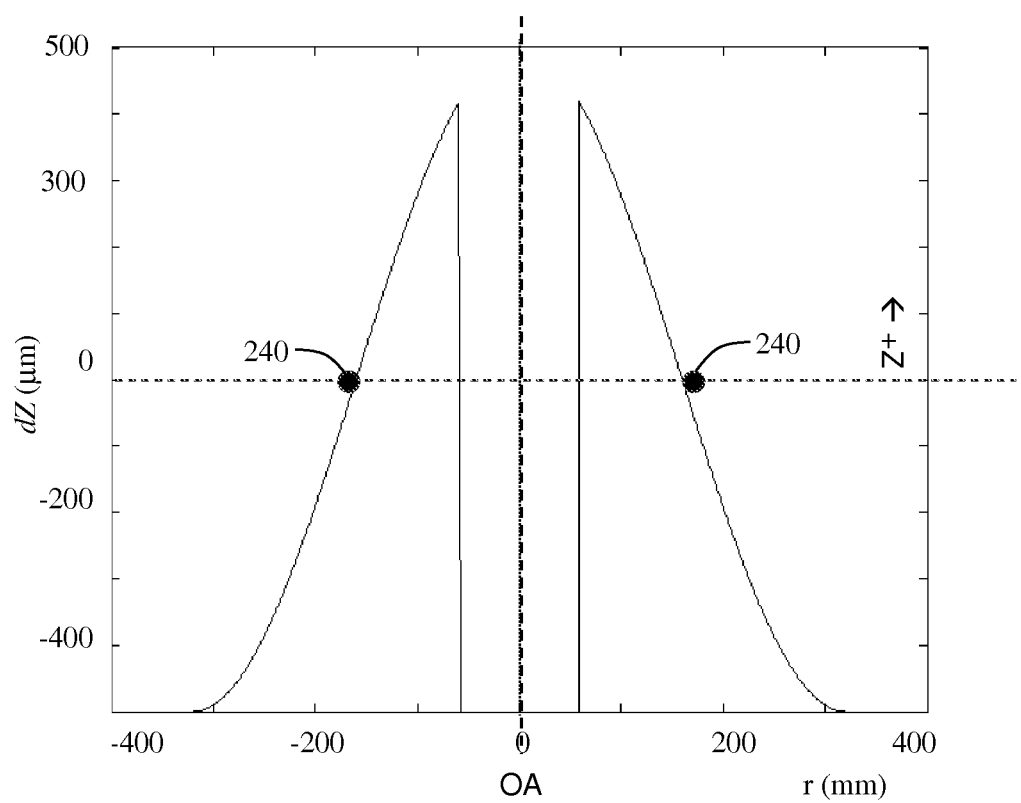
FIG. 4 is a graph that illustrates the shape of a collector of the EUV radiation source.

FIG. 4 is a graph that shows deviation dZ of the reflective surface of the collector CO from a perfect ellipsoid shape as a function of radial distance r from the centre of the collector (the centre of the collector corresponds with the optical axis OA). If the reflective surface of the collector CO had a perfect ellipsoid shape then the graph would be a straight line at dZ=0. Instead, it may be seen from the graph that the collector CO varies from the perfect ellipsoid shape (the collector CO is a modified ellipsoid shape).

An inner portion of the collector CO (i.e., the portion nearest to the optical axis OA) curves outwardly relative to a perfect ellipsoid shape by up to approximately 400 µm. The radial distance from the optical axis OA increases the depth of the outward curve decreases, until at a location 240, which is a radial distance of approximately 180 mm from the optical axis, the reflective surface intersects with a perfect ellipsoid shape. This point 240 corresponds with the location 240 shown in FIGS. 3a and 3b. Beyond approximately 180 mm from the optical axis, the collector CO curves inwardly relative to a perfect ellipsoid shape. The height of the inward curve increases with radial distance, to a maximum of approximately 500 µm.

An alternative description of the shape of the collector CO is that the collector is modified from a perfect ellipsoid shape as follows: fix the ellipsoid at an intermediate radial location 240, move the ellipse in the +Z direction at radial locations between the intermediate location 240 and the optical axis OA, and move the ellipse in the −Z direction at radial locations outside of the intermediate location 240.

As may be inferred from FIG. 4, the deviation dZ of the reflective surface of the collector CO from a perfect ellipsoid shape may be expressed as a cosine series $$dZ(r) = \Sigma A_i * \cos(k_i * r) \quad \text{(Equation 1)}$$

where $A_i$ and $k_i$ are constants, and r is the radial distance from the optical axis. It may be the case that higher order terms of Equation 1 do not significantly influence the uniformity of the radiation intensity at a location away from the aperture 250, in the direction of propagation of the EUV beam, such as for example the location of mirror 22. Where this applies Equation 1 may be simplified to:

$$dZ(r) = A_1 \cos\left(\frac{2\pi}{D} * r\right) \quad \text{(Equation 2)}$$

where D is the diameter of the collector.

The deviation of dZ of the reflective surface of the collector CO from a perfect ellipsoid shape is such that the collector CO is no longer a perfect ellipsoid shape. The collector thus does not have a unique first focal point that may be imaged perfectly to a unique second focal point. The plasma generation location 210 is close to what may be referred to as an approximate focus of the collector CO.

In an embodiment, the change in curvature d(dZ/dr)/dr of the collector (the second derivative of the reflective surface) is smallest close to the optical axis OA and close to the outer perimeter of the collector CO. The translation in the Z (and −Z) directions is greatest close to the optical axis OA and close to the outer perimeter of the collector CO.

In an embodiment, the shape of the reflective surface of the collector CO is rotationally symmetric about the optical axis OA. In other words, the shape is independent of the azimuth angle, and depends only on the radial distance from the optical axis OA.

Although FIG. 4 shows a specific set of dimensions of the reflective surface of the collector CO (relative to a perfect ellipsoid shape) the reflective surface of the collector may have other dimensions. For example, the deviation dZ of the collector from a perfect ellipsoid shape may be up to $1/100^{th}$ of the diameter of the collector (e.g., up to 6 mm for a 600 mm diameter collector). For example, the deviation dZ of the collector from a perfect ellipsoid shape may be $1/10000^{th}$ or more of the diameter of the collector (e.g., 0.06 mm or more for a 600 mm collector). The deviation dZ may be measured in a direction that is substantially perpendicular to the reflective surface of the collector CO.

The effect of the collector CO according to the invention is to reduce a spatial rate of change of radiation beam intensity at the first mirror 22. In other words, the uniformity of the intensity is improved.

The uniformity of the intensity is improved in the far field. The far field may be considered to be locations where the angular field distribution is substantially independent of distance from the source. In the context of the present invention, the far field is defined as a location of intensity distribution at a distance from the aperture 250 along the direction of propagation of the EUV radiation greater than $3*d/NA_{ap}$ where d is a diameter of the aperture 250, and $NA_{ap}$ is a numerical aperture of the EUV radiation beam traversing the aperture 250. Where this description refers to the uniformity of intensity at the first mirror 22, this may be considered to be equivalent to referring to the uniformity of intensity in the far field.

FIG. 5 is a graph that shows the normalised intensity I of radiation incident upon the first mirror 22 as a function of radial distance from the optical axis OA, as formed by a conventional prior art ellipsoid shape collector 300. The graph was generated using a simulation. As may be seen from FIG. 5, no radiation is incident on the first mirror 22 at the optical axis OA. This is due to the presence of the hole 230 in the collector 300 (see FIGS. 3a and 3b). As the radial distance increases from the optical axis, the intensity of radiation increases sharply to a maximum (normalised to 1), and then drops down to less than 0.3 at a radial distance of around 150 mm from the optical axis.

The radiation intensity profile shown in FIG. 5 is caused by a combination of the ellipsoid shape of the prior art collector 300, and variation in the effectiveness of the reflective surface of the collector. The reflective surface comprises a multi-layer coating, layers of the coating having thicknesses that are selected such that constructive interference is generated by the collector. This constructive interference gives rise to reflection. As the radial distance from the optical axis OA increases, the effectiveness of the multi-layer structure in providing constructive interference decreases, and the reflectivity of the collector thus also decreases. It is this reduction in the efficiency of the multi-layer coating, together with the shape of the collector, which results in the intensity profile shown in FIG. 5.

FIG. 6 is a graph that shows the normalised intensity of radiation incident at the first mirror 22 as a function of radial distance from the optical axis OA, as formed using a collector CO having the shape illustrated in FIG. 4. FIG. 6 was generated using a simulation. In common with FIG. 5, there is no radiation incident on the first mirror 22 at the optical axis OA. Also in common with FIG. 5, the intensity of the radiation increases sharply to a maximum (normalised to 1). The intensity of the radiation then reduces as a function of the radial distance from the optical axis. However, whereas in FIG. 5 the radial intensity at a radial distance of 150 mm was less than 0.3, the radial intensity at around 150 mm is well in excess of 0.3. Thus, the collector according to the embodiment of the invention reduces the rate at which the intensity of radiation decays across the surface of the first mirror 22. The intensity uniformity has been improved.

The embodiment of the invention provides a significant reduction of the rate at which the radiation intensity decreases across the first mirror 22. The rate of intensity decrease may for example be reduced by 20% or more, for example by up to 30%.

Modification of the collector CO from the perfect ellipsoid shape may be considered to provide two competing effects. Referring to FIG. 3b, the outwardly curved inner portion of the collector CO has stronger curvature than the conventional collector 300, and causes energy in the radiation beam in the far field to be moved outwards. Referring to FIG. 3a, the reduced distance between the plasma 210 and the outer portion of the collector CO causes energy in the radiation beam in the far field to be moved inwards. The balance between these two effects varies with radial distance. At the inner edge of the collector CO the outward energy redistribution of the radiation is modest. It increases as the radial distance increases, until an intermediate point 240 is reached. Beyond this intermediate point 240 the energy redistribution is inward rather than outward. The inward energy redistribution is weaker than the outward energy redistribution, and so the collector CO provides a net outward energy redistribution.

As explained further above, the deviation of the collector shape from a perfect ellipsoid shape may be a cosine function. Where this is the case, the energy redistribution provided by the collector CO may be governed by the derivative of the cosine function, i.e. a sine function. This provides outward energy redistribution that is relatively weak at the inner edge of the collector CO, but which increases as the distance from the inner edge increases. The sine function, and hence the outward energy redistribution, reaches a maximum at intermediate point 240, and then reduces gradually to zero at the outer edge of the collector CO. The change of the plasma generation location 210 (from conventional location 310) moves the plasma closer to the outer edges of the collector CO, and provides a modest inward energy redistribution. This modest inward energy redistribution prevents the radiation beam in the far field from merely becoming larger without providing a significant improvement of intensity uniformity.

Since the intensity profiles shown in FIGS. 5 and 6 are normalised, no differences between the peak intensities at the first mirror 22 are apparent in FIGS. 5 and 6. However, since the radial intensity decays more slowly across the first mirror 22 when the embodiment of the invention is used, it follows that for a given total intensity of radiation the peak radiation incident upon the first mirror 22 is reduced. Reducing the peak intensity of the radiation incident upon the first mirror 22 is advantageous because it reduces the likelihood that the mirror will be damaged by the radiation.

Although the intensity profile shown in FIG. 6 is not uniform, it has improved uniformity compared with the intensity profile shown in FIG. 5. Providing an intensity profile with improved uniformity is advantageous because it allows a more uniform radiation beam to be formed by the illuminator IL. A primary purpose of the illuminator IL is to provide radiation with a smooth intensity profile at the patterning device MA. By improving the intensity profile of the radiation that enters the illuminator IL, the invention allows the illuminator IL to provide radiation at the patterning device MA with a smoother intensity profile. This may help to improve the accuracy with which a pattern is projected from the patterning device MA to the substrate W (see FIG. 2).

In an alternative approach, if the uniformity of the radiation at the patterning device MA is merely required to fall within a predetermined threshold, then the invention may allow this requirement to continue to be met while replacing optics of the illuminator IL with less complex optics. For example, the number of field facet mirrors that comprise the first mirror 22 and the number of pupil facet mirrors that comprise the second mirror 24 may be reduced.

The extent to which the profile of the reflective surface of the collector is modified from the ellipsoid shape may be limited by the aperture 250 located between the collector CO and the first mirror 22 (see for example FIG. 3a). The effect of modifying the collector shape from a perfect ellipsoid shape is shown schematically in FIG. 3a. The rays that are reflected from the outer portion of the collector CO are not focussed at the aperture 250, but instead the radiation beam has a finite diameter at the aperture. This diameter may be controlled such that it is less than the diameter of the aperture 250. The diameter of the radiation beam at the aperture may be controlled via the amplitude of the constant A of Equation 1 (reducing the constant A will reduce the diameter of the radiation beam).

In an embodiment, the aperture 250 may have a given diameter, and it may be a requirement of the lithographic apparatus that substantially all of the radiation passes through the aperture 250. This may restrict the extent to which the radial profile of the reflective surface of the collector may be modified from a perfect ellipsoid shape (a perfect ellipsoid shape provides the strongest focussing). This may in turn restrict the degree to which the uniformity of the radial intensity profile at the first mirror 22 may be improved.

It may be possible in some instances to allow a proportion of the radiation beam to be clipped by the aperture 250. For example, 1-10% of the radiation beam (or more) could be clipped by the aperture 250. Allowing clipping of a proportion of the radiation beam may improve the uniformity of the radial intensity profile at the first mirror 22 (compared with the radial intensity profile in the absence of clipping), since this allows further modification of the shape of the reflective surface of the collector from a perfect ellipsoid shape.

Figure 7:
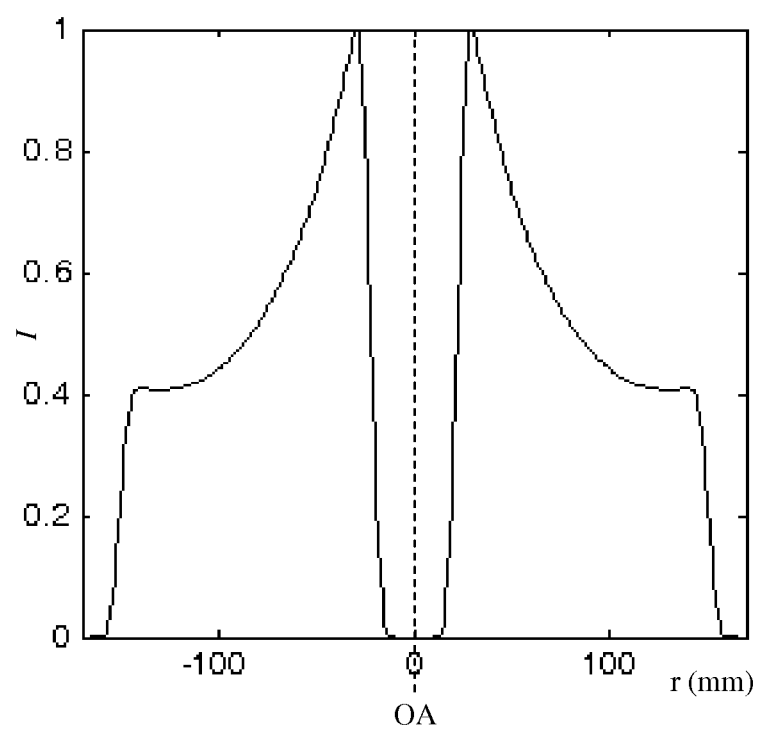
FIG. 7 is a graph that illustrates the intensity profile of radiation incident upon a first mirror of the lithographic apparatus according to an alternative embodiment of the invention.

In general, for an aperture 250 that has an optical effect, a larger diameter aperture will allow the shape of the reflective surface of the collector to be modified further from a perfect ellipsoid shape. This will in turn allow better intensity uniformity to be achieved at the first mirror 22. For example, an aperture of 12 mm diameter may allow a significantly improved intensity profile at the first mirror 22 compared to an aperture of 6 mm diameter. FIG. 7 shows the intensity profile at the first mirror 22, as calculated using a simulation, for an aperture of 12 mm diameter. Although significant peaks are still present close to the centre of the intensity profile, it may be seen that a significantly greater proportion of the intensity is spread out more evenly across the profile (i.e., across the first mirror).

The aperture 250 may for example have diameter that is equal to or greater than 2 mm, and may for example have a diameter that is greater than 15 mm. The aperture 250 may for example have a diameter that is equal to or less than 30 mm, and may for example have a diameter that is less than 15 mm.

In some instances, the aperture 250 may be sufficiently large that it has no significant optical effect (e.g. 20 mm diameter or greater). Where this is the case, the shape of the reflective surface of the collector may be selected to provide a desired radiation intensity profile at the first mirror 22, without having to take into account the effect of the aperture 250.

Embodiments of the invention provide some defocusing of the radiation at the aperture 250, as explained above. This defocusing at a pupil plane may provide an advantage in that the radiation is also defocused at other pupil planes in the lithographic apparatus. For example, referring to FIG. 2, the radiation may be defocused at the second mirror 24 of the illuminator IL. This may reduce the likelihood of high intensity radiation damaging the second mirror 24.

One manner in which collector shapes that provide a beneficial effect may be calculated is by using a simulation run on a program such as Matlab, which is available from MathWorks. The simulation may be configured to calculate the radial intensity profile in the far field as a function of collector aberration vectors, the collector aberration vectors being Fourier coefficients of the deviation dZ of the collector from a perfect ellipsoid. A Simplex method may then be used to calculate a merit function. The merit function may be the standard deviation profile divided by transmission through the aperture 250 raised to the fourth power. The position of the plasma may be allowed to move along the optical axis OA in the simulation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. An extreme ultraviolet (EUV) radiation source, comprising:
   a fuel supply configured to deliver droplets of fuel to a plasma formation location; and
   a collector configured to collect EUV radiation emitted by a plasma at the plasma formation location and reflect at least a portion of the collected EUV radiation through an aperture in a wall of the EUV radiation source to generate an EUV radiation beam,
   wherein the collector has a reflective surface that has a modified ellipsoid shape in relation to an ellipsoid, and wherein the modified ellipsoid shape includes an inner portion that curves outwardly relative to the ellipsoid and an outer portion that curves inwardly relative to the ellipsoid.

2. The EUV radiation source of claim 1, wherein deviation of the collector from the ellipsoid is up to 1/100th of the diameter of the collector, the deviation being measured in a direction substantially perpendicular to the reflective surface of the collector.

3. The EUV radiation source of claim 1, wherein deviation of the collector from the ellipsoid is 1/10000th or more of the diameter of the collector, the deviation being measured in a direction substantially perpendicular to the reflective surface of the collector.

4. The EUV radiation source of claim 1, wherein the modified ellipsoid shape deviates from the ellipsoid according to:

$$dZ(r)=\Sigma A_i * \cos(k_i * r)$$

where $dZ(r)$ is the deviation of the collector shape from the ellipsoid shape, $A_i$ and $k_i$ are constants, and $r$ is a radial distance from an optical axis of the EUV radiation source.

5. The EUV radiation source of claim 1, wherein the modified ellipsoid shape deviates from the ellipsoid according to a cosine function centered about an optical axis of the EUV radiation source.

6. The EUV radiation source of claim 1, wherein the plasma formation location is displaced relative to a focus of the collector, a displacement being in a direction toward the collector.

7. The EUV radiation source of claim 1, wherein the EUV radiation source is included in a lithographic apparatus, the lithographic apparatus comprising:
   an illumination system configured to condition the EUV radiation beam;
   a support constructed to support a patterning device, the patterning device being configured to impart the EUV radiation beam with a pattern in its cross-section to form a patterned radiation beam;
   a substrate table configured to hold a substrate; and
   a projection system configured to project the patterned radiation beam onto a target portion of the substrate.

8. The EUV radiation source of claim 7, wherein the aperture is located between the EUV radiation source and the illumination system.

9. The EUV radiation source of claim 1, wherein the collector is configured to reflect at least 90% of the collected EUV radiation through the aperture.

10. The EUV radiation source of claim 1, wherein the aperture has a diameter that is equal to or greater than 2 mm.

11. The EUV radiation source of claim 1, wherein the aperture has a diameter that is equal to or less than 30 mm.

12. A method of generating extreme ultraviolet (EUV) radiation, comprising:
    delivering droplets of fuel to a plasma formation location using a fuel supply; and
    collecting, using a collector, EUV radiation emitted by the plasma at the plasma formation location to provide an EUV radiation beam,
    guiding the EUV radiation beam through an aperture,
    wherein the collector has a reflective surface that has a modified ellipsoid shape in relation to an ellipsoid, and wherein the modified ellipsoid shape includes an inner portion that curves outwardly relative to the ellipsoid and an outer portion that curves inwardly relative to the ellipsoid.

13. An extreme ultraviolet (EUV) radiation source comprising:
    a fuel supply configured to deliver droplets of fuel to a plasma formation location; and
    a collector configured to collect EUV radiation emitted by a plasma at the plasma formation location, wherein the shape of the collector deviates from an ellipsoid according to a cosine function centered about an optical axis of the EUV radiation source.

14. The EUV radiation source of claim 13, wherein the plasma formation location is displaced relative to a focus of the collector, the displacement being in the direction toward collector.

* * * * *